(12) United States Patent
Tan et al.

(10) Patent No.: US 12,534,797 B2
(45) Date of Patent: Jan. 27, 2026

(54) VAPOR-PHASE PRECURSOR SEEDING FOR DIAMOND FILM DEPOSITION

(71) Applicants: Applied Materials, Inc., Santa Clara, CA (US); National University of Singapore, Singapore (SG)

(72) Inventors: Sze Chieh Tan, Singapore (SG); Vicknesh Sahmuganathan, Singapore (SG); Eswaranand Venkatasubramanian, Santa Clara, CA (US); Abhijit Basu Mallick, Sunnyvale, CA (US); John Sudijono, Singapore (SG); Jiteng Gu, Singapore (SG); Kian Ping Loh, Singapore (SG)

(73) Assignees: Applied Materials, Inc., Santa Clara, CA (US); National University of Singapore, Singapore (SG)

( * ) Notice: Subject to any disclaimer, the term of this patent is extended or adjusted under 35 U.S.C. 154(b) by 494 days.

(21) Appl. No.: 18/062,010

(22) Filed: Dec. 5, 2022

(65) Prior Publication Data

US 2023/0175120 A1 Jun. 8, 2023

Related U.S. Application Data

(60) Provisional application No. 63/286,087, filed on Dec. 5, 2021.

(51) Int. Cl.
C23C 16/27 (2006.01)
H01J 37/32 (2006.01)

(52) U.S. Cl.
CPC .......... *C23C 16/274* (2013.01); *C23C 16/279* (2013.01); *H01J 37/32192* (2013.01); *H01J 2237/3321* (2013.01)

(58) Field of Classification Search
CPC .............................. C23C 16/274; C23C 16/279
See application file for complete search history.

(56) References Cited

U.S. PATENT DOCUMENTS

| 5,397,558 A | 3/1995 | Miyanaga et al. |
| 7,306,674 B2 | 12/2007 | Dahl et al. |
| 7,309,476 B2 | 12/2007 | Carlson et al. |

(Continued)

FOREIGN PATENT DOCUMENTS

| JP | 2008085062 A | 4/2008 |
| JP | 2008229968 A | 10/2008 |

(Continued)

OTHER PUBLICATIONS

PCT International Search Report and Written Opinion in PCT/US2021/063483 dated Apr. 12, 2022, 11 pages.

(Continued)

*Primary Examiner* — Kelly M Gambetta
(74) *Attorney, Agent, or Firm* — SERVILLA WHITNEY LLC

(57) ABSTRACT

Methods of depositing an adamantane film are described, which may be used in the manufacture of integrated circuits. Methods include processing a substrate in which an adamantane seed layer is deposited on a substrate, converting to a diamond nuclei layer having an increased crystallinity relative to the adamantane seed layer and then grown into full nanocrystalline diamond film from the diamond nuclei layer.

19 Claims, 2 Drawing Sheets

(56) References Cited

U.S. PATENT DOCUMENTS

| | | | |
|---|---|---|---|
| 7,795,468 | B2 | 9/2010 | Liu et al. |
| 8,105,660 | B2 | 1/2012 | Tudhope et al. |
| 8,420,768 | B2 | 4/2013 | Dahl |
| 2007/0251446 | A1* | 11/2007 | Dahl .................. C23C 16/02 117/104 |
| 2009/0029067 | A1* | 1/2009 | Sciamanna ............. C23C 16/26 427/577 |
| 2009/0176035 | A1 | 7/2009 | Tudhope et al. |
| 2010/0112214 | A1 | 5/2010 | Dahl et al. |
| 2019/0127846 | A1 | 5/2019 | Tudhope et al. |

FOREIGN PATENT DOCUMENTS

| | | |
|---|---|---|
| RU | 2171859 C1 | 8/2001 |
| WO | 9533864 A1 | 12/1995 |
| WO | 2007111967 A2 | 10/2007 |
| WO | 2008026395 A1 | 3/2008 |
| WO | 2020092885 A1 | 5/2020 |
| WO | 2022132879 A1 | 6/2022 |

OTHER PUBLICATIONS

Chen, Yi-Chun, et al., "Chemical vapor deposition of diamond on silicon substrates coated with adamantane in glycol chemical solutions", RSC Advances, 2013, 3, 1514.

Leroy, Eric, et al., "Chemical vapor deposition of diamond growth using a chemical precursor", Applied Physics Letters 73, 1050 (1998), 4 pages.

Mandal, Soumen, et al., "Chemical Nucleation of Diamond Films", ACS Appl. Mater. Interfaces, Just Accepted Manuscript, Sep. 2016, <downloaded from the web: http://pubs.acs.org> Sep. 17, 2016, 21 pages.

Ree, Brian J., et al., "Nanoscale film morphology and property characteristics of dielectric polymers bearing monomeric and dimeric adamantane units", Polymer 169 (2019) 225-233.

Spohn, Matthias, et al., "Poly(1-vinyladamantane) as a Template for Nanodiamond Synthesis", ACS Appl. Nano Mater., 2018, 1, 6073-6080.

Sternschulte, H., et al., "Comparison of MWPCVD diamond growth at low and highprocess gas pressures", Diamond and Related Materials, vol. 15, Issues 4-8, Apr.-Aug. 2006, pp. 542-547.

Sultane, Prakash R., et al., "Stereoelectronically Directed Photodegradation of Poly(adamantyl Vinyl Ketone)", Macromol. Rapid Commun. 2019, 1900302.

Tiwari, Rajanish N., et al., "Enhanced Nucleation and Growth of Diamond Film on Si by CVD Using a Chemical Precursor", J. Phys. Chem. C 2011, 115, 16063-16073.

Tsugawa, K., et al., "Nucleation Enhancement of Nanocrystalline Diamond Growth at Low Substrate Temperatures by Adamantane Seeding", J. Phys. Chem. C 2010, 114, 3822-3824.

Wang, Kemin, et al., "Photopolymerization of 1-Adamantyl Acrylate Pohotoinitiated by Free Radical Photoinitiators", Journal of Applied Polymer Science, vol. 123, 26-31 (2012).

PCT International Search Report and Written Opinion in PCT/US2022/051880 dated Apr. 25, 2023, 8 pages.

Chen, et al., "Chemical vapor deposition of diamond on an adamantane-coated sapphire substrate", RSC Adv., 2014, 4, 18945.

Dahl, et al., "Isolation and Structure of Higher Diamondoids, Nanometer-Sized Diamond Molecules", Jan. 3, 2003, vol. 299, Science.

Jiang, et al., "Nucleation and initial growth phase of diamond thin films on (100) silicon", The American Physical Society, vol. 50, No. 12, Sep. 15, 1994.

Tiwari, et al., "Chemical Precursor for the Synthesis of Diamond Films at Low Temperature", Applied Physics Express 3 (2010) 045501.

Tiwari, et al., "Growth, microstructure, and field-emission properties of synthesized diamond film on adamantane-coated silicon substrate by microwave plasma chemical vapor deposition", J. Appl. Phys. 107, 103305 (2010); https://doi.org/10.1063/1.3427436.

Tiwari, et al., "The synthesis of diamond films on adamantane-coated Si substrate at low temperature", Chemical Engineering Journal 158 (2010) 641-645.

Umeno, et al., "Deposition of DLC film from adamantane by using pulsed discharge plasma CVD", Diamond & Related Materials 17 (2008) 684-687.

Williams, O.A., "Nanocrystalline diamond", Diamond & Related Materials 20 (2011) 621-640.

Yang, et al., "Effects of secondary pretreatments of substrate on the nucleation of diamond film", Journal of Materials Research, vol. 11, No. 7, Jul. 1996.

"Machine Translation of RU2171859C1".

* cited by examiner

VAPOR-PHASE PRECURSOR SEEDING FOR DIAMOND FILM DEPOSITION

CROSS-REFERENCE TO RELATED APPLICATIONS

This application claims priority to U.S. Provisional Application No. 63/286,087, filed Dec. 5, 2021, the entire disclosure of which is hereby incorporated by reference herein.

TECHNICAL FIELD

Embodiments of the present disclosure pertain to methods of depositing nanocrystalline diamond films. More particularly, embodiments of the disclosure pertain to deposition of nanocrystalline diamond films during the manufacture of electronic devices, and in particular, integrated circuits (ICs).

BACKGROUND

As the semiconductor industry introduces new generations of integrated circuits (ICs) having higher performance and greater functionality, the density of the elements that form those ICs is increased, while the dimensions, size, and spacing between the individual components or elements are reduced. While in the past, such reductions were limited only by the ability to define the structures using photolithography, device geometries having dimensions measured in μm or nm have created new limiting factors such as the conductivity of the metallic elements, the dielectric constant of the insulating material(s) used between the elements, or challenges in 3D-NAND or DRAM processes. These limitations may be addressed by more durable and higher hardness hard masks.

Conventionally, nanodiamonds (ND) are seeded onto silicon via abrasion or sonication. This creates defects on the wafer surface. Moreover, ND have high $sp^2$ content which is unfavorable for the nanocrystalline diamond (NCD) film properties. From a manufacturing perspective, the capability to dry-seed NCD precursors onto silicon allows for the integration of processes into large scale production. Adamantane, a highly volatile molecule with high $sp^3$ content, is a potential replacement of the ND seeds.

Bestowed with superior hardness, chemical inertness and high thermal conductivity, diamond has emerged as a promising candidate for a myriad of microelectronic applications. However, the huge discrepancy in the surface energies of diamond and silicon (~6 $J/cm^2$ vs ~1.5 $J/cm^2$), low sticking coefficients of the gaseous precursors (e.g., hydrocarbon radicals) and strong competition from the nondiamond phases typically result in poor diamond nucleation density on untreated silicon. Yet, to synthesize good quality nanocrystalline diamond (NCD) films, nucleation density of $>10^{11}$ $cm^{-2}$ is targeted.

To address the nucleation density issues, the substrate is often pre-treated (e.g., mechanical abrasion or micro-chipping) and/or seeded with nano-diamond (ND) particles (~5 nm) prior to deposition. However, the presence of scratches on the substrate surface is deleterious for microelectronic applications. Moreover, the wide grain size distribution and high $sp^2$ carbon content in ND particles are disadvantageous for the growth of an ultrasmooth continuous NCD film. Most importantly, these multi-step procedures are cumbersome and not cleanroom compatible. This has driven a motivation for a cleanroom compatible dry-seeding procedure capable of depositing a uniform layer of seeds on the silicon substrate.

Being the smallest "molecular diamond", adamantane ($C_{10}H_{16}$) has a cage-shaped structure resembling the subunit excised from a diamond crystal lattice. Together with its ultrasmall molecular size (<1 nm), adamantane and its derivatives have been explored as seeds for the potential growth of diamond in both solution and vapor-phase seeding systems.

Despite so, vapor-phase delivery of adamantane remains a challenge due to its high vapor pressure and low sublimation point. This leads to significant evaporation of adamantane from the substrate, especially under high temperature and/or vacuum systems. Subsequently, low nucleation density and non-uniform distribution of diamond growth results. Accordingly, there is a need in the art for improved methods of forming diamond films.

SUMMARY

One or more embodiments of the disclosure are directed to methods of forming a nanocrystalline diamond film. An adamantane seed layer is formed by exposing a substrate surface to adamantane vapor in a first plasma process chamber for a first time and generating a first plasma in the first plasma process chamber for a first plasma time. The adamantane seed layer is converted to a diamond nuclei layer having an increased crystallinity relative to the adamantane seed layer. A full nanocrystalline diamond film is grown from the diamond nuclei layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
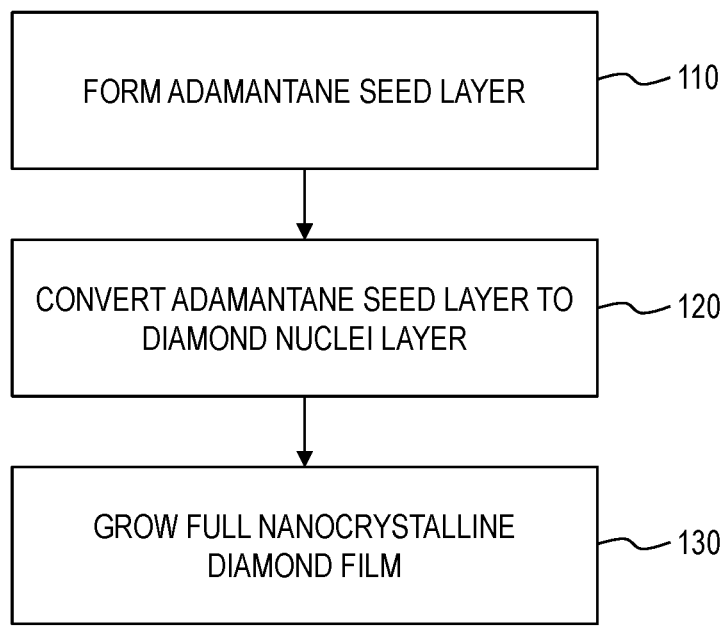
FIG. 1 illustrates a flow diagram of a method according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, gallium nitride, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. As an example where a film/layer or partial film/layer has been deposited onto a substrate surface, the exposed surface of the newly deposited film/layer becomes the substrate surface.

As used in this specification and the appended claims, the terms "precursor," "reactant," "reactive gas," and the like are used interchangeably to refer to any gaseous species that can react with the substrate surface.

As used herein, the phrase "nanocrystalline diamond" refers a solid film of diamond typically grown on a substrate, such as silicon. In one or more embodiments, nanocrystallinity is the result of the enhanced re-nucleation reaction in diamond growth, where the growth of diamond crystal is disrupted due to the fluctuation of surrounding environments such as the amounts of radical species, temperature, and pressure. In one or more embodiments, nanocrystalline diamond layers are mainly comprised of small diamond crystals in nanospheres, or a nanocolumnar shape, and amorphous carbon distributed usually distributed in the positions between surrounding crystals or accumulate in the grain boundaries. Nanocrystalline diamond is used as a hard mask material in semiconductor applications because of its chemical inertness, optical transparency, and good mechanical properties.

As used herein, the term "adamantane" refers to the broad class of adamantane family inclusive but not limited to commercially available and/or self-synthesized adamantane, its derivatives, oligomers, and polymers.

Embodiments of the disclosure describe the development and utilization of a novel method for the dry seeding of adamantane onto silicon via vapor phase delivery. The disclosure demonstrates the seeding, conversion, and growth of adamantane into nanocrystalline diamond film. In this work, adamantane vapor was released into a chamber in a controlled manner and seeded onto a silicon substrate. The seeded sample was then subjected to incubation and main growth where the adamantane "seeds" undergo a series of conversion to form NCD film.

Due to the high volatility of adamantane, few studies were successful in demonstrating the seeding of adamantane vapor phase delivery, of which the resulting film was non-uniform or diamond-like carbon in nature. Instead, most attempts involved wet chemical synthesis or preparation. Even then, only localized islands of NCD were observed. One or more embodiments of the disclosure provide in-situ, vapor-phase delivery, and dry-seeding of adamantane for the deposition of uniform NCD films.

Some embodiments of the disclosure advantageously provide methods where, unlike sonication, the integrity of the wafer surface is kept intact, reducing the probability of defects occurring. Some embodiments provide a dry-seeding process that allows for the integration of various processes, which is beneficial for tool development and large-scale production. The small molecular size and high $sp^3$ content of adamantane could potentially help to achieve NCD films of higher hardness and modulus while maintaining low surface roughness.

The conventional multi-step solution-based seeding of NCD is cumbersome and not cleanroom compatible. Embodiments of the disclosure provide methods for the vapor-phase delivery and dry-seeding of adamantane onto silicon substrate, for the subsequent growth of NCD films. One or more embodiments of the methods are in-situ and cleanroom compatible.

Device manufacturers using a carbon-based hard mask layer demand requirements be met: (1) high selectivity of the hard mask during the dry etching of underlying materials, (2) low film roughness, (3) low film stress, and (4) film strippability. As used herein, the term "dry etching" generally refers to etching processes where a material is not dissolved by immersion in a chemical solution and includes methods such as plasma etching, reactive ion etching, sputter etching, and vapor phase etching.

In one or more embodiments, a nanocrystalline diamond layer is formed on a substrate. The process of one or more embodiments advantageously produces a nanocrystalline diamond layer with high density, high hardness, high etch selectivity, low stress, and excellent thermal conductivity.

Hard masks are used as etch stop layers in semiconductor processing. Ashable hard masks have a chemical composition that allows them to be removed by a technique referred to as ashing once they have served their purpose. An ashable hard mask is generally composed of carbon and hydrogen with trace amounts of one or more dopants (e.g., nitrogen, fluorine, boron, silicon). In a typical application, after etching, the hard mask has served its purpose and is removed from the underlying layer. This is generally accomplished, at least in part, by ashing, also referred to as "plasma ashing" or "dry stripping." Substrates with hard masks to be ashed, generally partially fabricated semiconductor wafers, are placed into a chamber under vacuum, and oxygen is introduced and subjected to radio frequency power, which creates oxygen radicals (plasma). The radicals react with the hard mask to oxidize it to water, carbon monoxide, and carbon dioxide. In some instances, complete removal of the hard mask may be accomplished by following the ashing with additional wet or dry etching processes, for example when the ashable hard mask leaves behind any residue that cannot be removed by ashing alone.

Hard mask layers are often used in narrow and/or deep contact etch applications, where photoresist may not be thick enough to mask the underlying layer. This is especially applicable as the critical dimension shrinks.

V-NAND, or 3D-NAND, structures are used in flash memory applications. V-NAND devices are vertically stacked NAND structures with a large number of cells arranged in blocks. As used herein, the term "3D-NAND" refers to a type of electronic (solid-state) non-volatile computer storage memory in which the memory cells are stacked in multiple layers. 3D-NAND memory generally includes a plurality of memory cells that include floating-gate transistors. Traditionally, 3D-NAND memory cells include a plurality of NAND memory structures arranged in three dimensions around a bit line.

An important step in 3D-NAND technology is slit etch. As the number of tiers increases in each technology node, to control the slit etch profile, the thickness of the hard mask film has to proportionally increase to withstand high aspect etch profiles. Currently, amorphous carbon (aC:H) films are used due to high hardness and easy to strip after slit etch.

However, amorphous carbon hard mask films have delamination at bevel and poor morphology, leading to pillar striations.

Figure 2A:
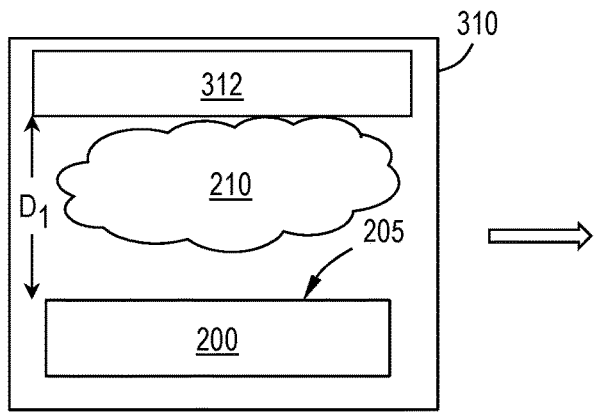
FIGS. 2A through 2E illustrates a cross-sectional schematic view of a substrate during the method according to one or more embodiments.
Figure 2B:
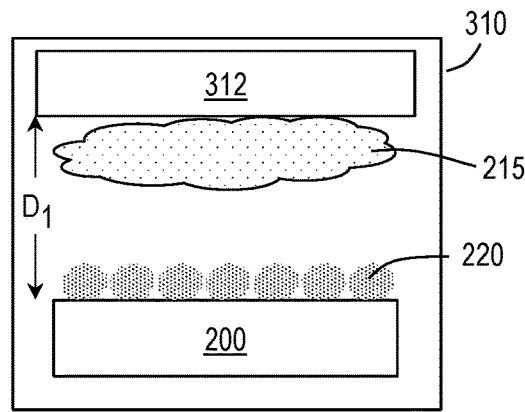
Figure 2D:
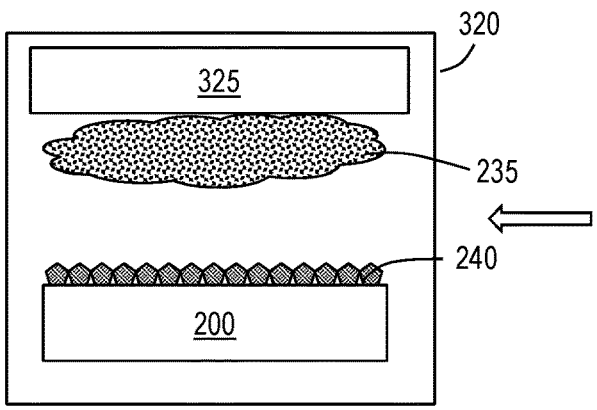
Figure 2C:
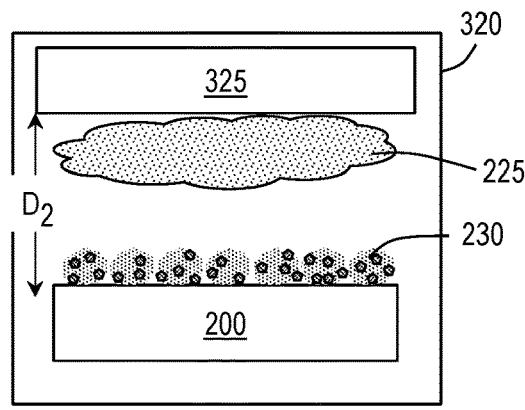
Figure 2E:
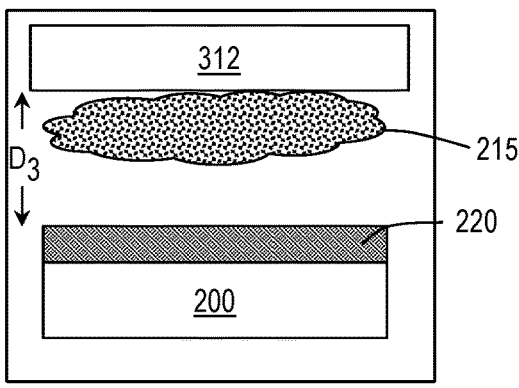

Referring to FIGS. 1 and 2A through 2E, one or more embodiments of the disclosure are directed to methods 100 of forming a nanocrystalline diamond film. At operation 110, a substrate 200 having a substrate surface 205 is exposed to adamantane vapor 210 in a first plasma process chamber 310. The adamantane vapor 210 is exposed to the substrate surface 205 for a first time period T1. The substrate surface 205 is then exposed to a first plasma 215 in the first plasma process chamber for a first plasma time period TP1 to form an adamantane seed layer 220 on the substrate surface 205. In some embodiments, the adamantane seed layer 220 is formed without exposure to the first plasma 215 in the first plasma process chamber. In some embodiments the adamantane seed layer 220 is formed by a thermal process (meaning that there is no plasma exposure).

The first plasma process chamber 310 can be any suitable plasma chamber with any suitable plasma source (e.g. remote, microwave, capacitively coupled plasma (CCP), or inductively coupled plasma (ICP)), such as one of the process chambers described above. In some embodiments, flow rates and other processing parameters described below are for a 300 mm substrate. It should be understood these parameters can be adjusted based on the size of the substrate processed and the type of chamber used without diverging from the embodiments disclosed herein. In specific embodiments, the first plasma 215 comprises one or more of a capacitively coupled plasma, inductively coupled plasma, pulsed discharge plasma, hot filament or electron cyclotron resonance plasma.

In some embodiments, the first plasma 215 comprises one or more of argon (Ar), molecular nitrogen ($N_2$), an organic species having the empirical formula $C_xH_y$, where y is 2x+2, 2x or 2x−2, carbon dioxide ($CO_2$) or molecular hydrogen gas ($H_2$). In some embodiments, the adamantane vapor is coflowed with the first plasma gas. In some embodiments, the adamantane vapor is not flowed during plasma generation.

In some embodiments, the first plasma 215 is generated with a power greater than 50 watts, 100 watts or 150 watts. In some embodiments, the substrate 200 is maintained at a temperature in the range of 20-600° C. during formation of the adamantane seed layer 220.

In some embodiments, forming the adamantane seed layer 220 comprises more than one cycle of exposure to the adamantane vapor 210 and first plasma 215. In some embodiments, forming the adamantane seed layer 220 comprises in the range of 1 to 1000 cycles of exposures to the adamantane vapor and the first plasma.

The first plasma process chamber 310 of some embodiments comprises a showerhead/electrode 312 (also referred to as the first plasma source) positioned at a first distance $D_1$ from the substrate surface 205. In some embodiments, the first distance $D_1$ is greater than or equal to 10 mm, 15 mm, 20 mm, or 25 mm.

At operation 120, the adamantane seed layer 220 is converted to a diamond nuclei layer 230. The diamond nuclei layer 230 is the adamantane seed layer 220 after a partial crystallization process. The conversion to the diamond nuclei layer 230 is a partial conversion process where at least a portion of the adamantane seed layer 220 crystal character is increased.

The adamantane seed layer 220 of some embodiments is converted to the diamond nuclei layer 230 in a second plasma process chamber 320 with a second plasma 225 generated by a plasma source 325. The second plasma process chamber can be any suitable plasma chamber with any suitable plasma source (e.g. remote, microwave, capacitively coupled plasma (CCP), or inductively coupled plasma (ICP)), such as one of the process chambers described above. In some embodiments, flow rates and other processing parameters described below are for a 300 mm substrate. It should be understood these parameters can be adjusted based on the size of the substrate processed and the type of chamber used without diverging from the embodiments disclosed herein. In specific embodiments, the second plasma 225 comprises one or more of a capacitively coupled plasma, inductively coupled plasma, pulsed discharge plasma, hot filament or electron cyclotron resonance plasma.

In some embodiments, the second plasma 225 comprises one or more of argon (Ar), molecular nitrogen ($N_2$), an organic species having the empirical formula $C_xH_y$, where y is 2x+2, 2x or 2x−2, carbon dioxide ($CO_2$) or molecular hydrogen gas ($H_2$). In some embodiments, the adamantane vapor is coflowed with the first plasma gas. In some embodiments, the adamantane vapor is not flowed during plasma generation.

In some embodiments, the second plasma 225 is generated with a second plasma source with a power less than or equal to 10 kilowatts, 9 kW, 8 kW, 7 kW, 6 kW, 5 kW or 4 kW. In some embodiments, the second plasma 225 is a pulsed plasma with a duty cycle less than or equal to 75%, 70%, 65%, 60%, 55%, 50%, 45% or 40% at a frequency in the range of 50 Hz to 100 Hz, or in the range of 60 Hz to 90 Hz, or in the range of 70 Hz to 80 Hz. In some embodiments, the second plasma 225 is operated in continuous mode (100% duty cycle). In some embodiments, the second plasma 225 has a power less than or equal to 6 kW with a duty cycle less than or equal to 50% at a frequency in the range of 70 Hz to 80 Hz. In some embodiments, the substrate 200 is maintained at a temperature in the range of 50-600° C. during conversion of the adamantane seed layer 220 to the diamond nuclei layer 230.

In some embodiments, the substrate 200 is positioned at a second distance D2 from plasma source 325. In some embodiments, the substrate 200 is positioned at a distance D2 less than or equal to 12 cm, 11 cm, 10 cm, 9 cm or 8 cm from the plasma source 325. In some embodiments, the second plasma source 325 comprises a showerhead which acts as an electrode.

The diamond nuclei layer 230 has increased crystallinity relative to the adamantane seed layer 220. In some embodiments, the crystallinity of the diamond nuclei layer 230 is increased by greater than or equal to 10%, 15%, 20%, 25%, 30%, 35%, 40%, 45% or 50%.

At operation 130, a full nanocrystalline diamond film 240 is grown from the diamond nuclei layer 230. As used in this manner, the term "grown" means that the full nanocrystalline diamond film 240 is formed on the diamond nuclei layer 230 and may incorporate the diamond nuclei layer 230 into the full nanocrystalline diamond film 240. The full nanocrystalline diamond film 240 can be epitaxially grown or deposited by any suitable technique known to the skilled artisan.

In some embodiments, growing the full nanocrystalline diamond film 240 occurs in the second plasma process chamber 320 using a third plasma 235 (Which may also be referred to as a strong plasma). In some embodiments, the full nanocrystalline diamond film 240 is grown using a conductively/inductively coupled plasma, microwave plasma, pulsed discharge plasma, hot filament or electron cyclotron resonance plasma. In some embodiments, the full nanocrystalline diamond film 240 is grown using a microwave plasma. In some embodiments, the full nanocrystalline diamond film 240 is formed in a different process chamber using the second plasma 225. In some embodiments, the full nanocrystalline diamond film 240 is formed in the same process chamber as the formation of the adamantane seed layer 220 and/or diamond nuclei layer 230.

In some embodiments, the third plasma 235 comprises a microwave plasma having a power greater than or equal to 50 W, 3 kW, 4 kW or 5 kW with a duty cycle greater than or equal to 60%, 65%, 70%, 75% or 80%.

In some embodiments, the substrate 200 is maintained at a temperature in the range of room temperature (25° C.) to 750° C. during exposure to the third microwave plasma. In some embodiments, the substrate 200 is maintained at a temperature greater than room temperature (25° C.), 50° C., 75° C., 100° C., 150° C., 200° C. or 250° C. during exposure to the third microwave plasma 235.

During operation 130, the substrate 200 is positioned a distance D3 from the plasma source 230. In some embodiments, the distance D3 is the same as the distance D2. In some embodiments, the distance D3 is decreased from the distance D2. In some embodiments, the substrate 200 is positioned at a distance from the third microwave plasma source of less than 12 cm, 11 cm, 10 cm, 9 cm or 8 cm.

In some embodiments, to prepare the supply of adamantane vapor, 1-100 g of adamantane can be transferred into an ampoule connected to the chamber and pre-heated between 25-100° C. In some embodiments, a piece of silicon wafer can be loaded into a capacitively coupled plasma (CCP) chamber and dry-cleaned by a plasma. In some embodiments, the plasma can be followed by a supply of adamantane gas mixture for a certain period of time. Thereafter, in some embodiments, a $C_xH_{2x+2}/CO_2/H_2$ CCP is struck between 50-800 W for 1-3600 seconds to facilitate the adsorption of adamantane onto the silicon substrate. This seeding procedure can be repeated for 1-1000 cycles. The stage temperature in some embodiments is maintained at less than 600° C. throughout the entire process and the gap between the stage and plasma source can be set greater than or equal to 10 mm.

In some embodiments, the seeded wafer is then transferred to a microwave (MW) plasma CVD chamber for subsequent incubation and main growth processes. A $C_xH_{2x+2}/CO_2/H_2$ MW plasma at a power greater than 50 W and 10-100% duty cycle is generated. The substrate support temperature was maintained between 50 C and 600° C. and the gap between the substrate and plasma source is maintained less than 12 cm.

In some embodiments, after 0.5-6 hours incubation, a third microwave plasma is applied at 50 W-12 kW and 60-100% duty cycle for operation 130 to form the full nanocrystalline diamond film. The substrate support is maintained at a temperature and gap of 100-750° C. and less than 10 cm, respectively, for more than 2 hours.

In some embodiments, the substrate is then subjected to an additional 2-10 hours of main growth with the third microwave plasma. In some embodiments, the small diamond particles continue to grow and eventually form a well-faceted, almost fully coalesced NCD film.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a nanocrystalline diamond film, the method comprising:
   forming an adamantane seed layer by exposing a substrate surface to adamantane vapor in a first plasma process chamber for a first time and generating a first plasma in the first plasma process chamber for a first plasma time;
   converting the adamantane seed layer to a diamond nuclei layer having an increased crystallinity relative to the adamantane seed layer in a second plasma process chamber with a second plasma including a second plasma source; and
   growing a full nanocrystalline diamond film from the diamond nuclei layer.

2. The method of claim 1, wherein forming the adamantane seed layer comprises in the range of 1 to 1000 cycles of exposure to the adamantane vapor and the first plasma.

3. The method of claim 1, wherein the first plasma process chamber comprises a showerhead/electrode positioned at a first distance from the substrate surface, the first distance greater than 10 mm.

4. The method of claim 1, wherein the first plasma comprises of either conductively/inductively coupled plasma, microwave plasma, pulsed discharge plasma, hot filament or electron cyclotron resonance plasma.

5. The method of claim 4, wherein the first plasma comprises one or more of argon, nitrogen, $C_xH_y$, carbon dioxide or molecular hydrogen gases.

6. The method of claim 4, wherein the first plasma has a power more than 50 watts.

7. The method of claim 4, wherein the substrate is maintained at a temperature between 20-600° C.

8. The method of claim 1, wherein the second plasma process chamber comprises of either conductively/inductively coupled plasma, microwave plasma, pulsed discharge plasma, hot filament or electron cyclotron resonance plasma.

9. The method of claim 8, wherein second plasma comprises one or more of a power less than 10 kW.

10. The method of claim 8, wherein the substrate is positioned at a distance from the second plasma source less than 10 cm.

11. The method of claim 8, wherein the substrate is maintained at a temperature in the range of 50° C. to 600° C.

12. A method of forming a nanocrystalline diamond film, the method comprising:
   forming an adamantane seed layer by exposing a substrate surface to adamantane vapor in a first plasma process chamber for a first time and generating a first plasma in the first plasma process chamber for a first plasma time;

converting the adamantane seed layer to a diamond nuclei layer having an increased crystallinity relative to the adamantane seed layer; and growing a full nanocrystalline diamond film from the diamond nuclei layer in a second plasma process chamber using a conductively/inductively coupled plasma, microwave plasma, pulsed discharge plasma, hot filament or electron cyclotron resonance plasma.

13. The method of claim 12, wherein the second plasma comprises one or more of a power greater than 50 W with a duty cycle greater than 60%.

14. The method of claim 12, wherein the substrate is maintained at a temperature in the range of room temperature to 750° C.

15. The method of claim 12, wherein the substrate is positioned a distance from the second plasma source of less than 10 cm.

16. A method of forming a nanocrystalline diamond film, the method comprising:

forming an adamantane seed layer by exposing a substrate surface to adamantane vapor in a first plasma process chamber for a first time and generating a first plasma in the first plasma process chamber for a first plasma time, the first plasma comprises one or more of argon, nitrogen, $C_xH_y$, carbon dioxide or molecular hydrogen gases, the substrate surface is positioned a first distance from a first plasma source in the first plasma chamber greater than or equal to 10 mm; converting the adamantane seed layer to a diamond nuclei layer having an increased crystallinity relative to the adamantane seed layer in a second plasma process chamber with a second plasma, a second plasma source generating the second plasma comprising one or more of a power less than 10 kW, the substrate surface positioned a distance of less than 10 cm from the second plasma source; and growing a full nanocrystalline diamond film from the diamond nuclei layer in the second plasma process chamber using a third plasma comprising one or more of a power greater than 50 W with a duty cycle greater than 60%.

17. The method of claim 16, wherein forming the adamantane seed layer comprises in the range of 1 to 1000 cycles of exposure to the adamantane vapor and the first plasma, the first plasma comprises either conductively/inductively coupled plasma, microwave plasma, pulsed discharge plasma, hot filament or electron cyclotron resonance plasma, has a power more than 50 watts, and the substrate is maintained at a temperature between 20-600° C.

18. The method of claim 17, wherein the second plasma process chamber comprises either conductively/inductively coupled plasma, microwave plasma, pulsed discharge plasma, hot filament or electron cyclotron resonance plasma, the substrate is maintained at a temperature in the range of 50° C. to 600° C.

19. The method of claim 18, wherein growing the full nanocrystalline diamond film occurs with the substrate maintained at a temperature in the range of room temperature to 750° C. and the substrate is positioned a distance from the plasma source of less than 10 cm.

* * * * *